United States Patent
Lin (10) Patent No.: US 9,395,409 B2
(45) Date of Patent: Jul. 19, 2016

(54) BURN-IN SOCKET WITH A HEAT SINK

(71) Applicant: HON HAI PRECISION INDUSTRY CO., LTD., New Taipei (TW)

(72) Inventor: Wei-Chih Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 77 days.

(21) Appl. No.: 14/312,631

(22) Filed: Jun. 23, 2014

(65) Prior Publication Data

US 2014/0375345 A1 Dec. 25, 2014

(30) Foreign Application Priority Data

Jun. 21, 2013 (TW) .............................. 102211744 U (51) Int. Cl.
*G01R 31/28* (2006.01)
*G01R 1/04* (2006.01)

(52) U.S. Cl.
CPC .......... *G01R 31/2863* (2013.01); *G01R 1/0458* (2013.01); *G01R 1/0466* (2013.01)

(58) Field of Classification Search
CPC ................... H01L 2924/0002; H01L 2924/00; H01L 2023/405; H01L 2023/4062; H01L 2023/4087; H01L 23/373; H01L 23/4006; H01L 23/4093; H01L 23/42; G01R 1/0466; G01R 1/0458; G01R 31/2863
USPC ............. 324/750.06, 750.01, 750.05; 439/68, 439/330, 331
See application file for complete search history.

(56) References Cited

U.S. PATENT DOCUMENTS

| | | | | |
|---|---|---|---|---|
| 5,944,093 A | * | 8/1999 | Viswanath | .......... F28D 15/0241 165/104.26 |
| 2003/0032322 A1 | * | 2/2003 | Nakamura | .......... H01L 23/4093 439/330 |
| 2003/0132770 A1 | * | 7/2003 | Conroy | ................ G01R 1/0466 324/750.06 |
| 2006/0171122 A1 | * | 8/2006 | Malone | ............... H01L 23/4006 361/704 |
| 2009/0246982 A1 | * | 10/2009 | Lin | ...................... H05K 7/1084 439/68 |
| 2009/0317988 A1 | * | 12/2009 | Lin | ...................... G01R 1/0466 439/68 |
| 2014/0099816 A1 | * | 4/2014 | Hsieh | ................... G01R 1/0466 439/331 |

FOREIGN PATENT DOCUMENTS

TW M447001 2/2013

* cited by examiner

*Primary Examiner* — Vincent Q Nguyen
(74) *Attorney, Agent, or Firm* — Wei Te Chung; Ming Chieh Chang (57) ABSTRACT

An burn-in socket electrically connecting an IC package to a PCB, has a base, a cover, a plurality of contacts and a block-shaped heat sink. The base defines a receiving space for the IC package. The cover is pin-jointed to one side by a pivot of the base and able to rotate around the pivot. A plurality of contacts are retained in the base and partially exposed in the receiving space. The heat sink is located above the IC package and against to the IC package so as to apply its gravity force to the IC package. A top face of the heat sink is below the top face of the cover.

6 Claims, 8 Drawing Sheets

BURN-IN SOCKET WITH A HEAT SINK

FIELD OF THE INVENTION

The present invention generally relates to an electrical connector electrically connecting an IC (integrated circuit) package to PCB (printed circuit board).

DESCRIPTION OF RELATED ART

IC package is widely used in computing field. Each IC package should be tested for stability and security. High-temperature test in a burn-in socket is one among these testing processes. Of course, the IC package also need be cooled in the high-temperature environment to avoid being burnt out. A water-cooled machine is usually located at the top of the burin-in socket to transport heat from the IC package. But as we know, the IC package is supported by electrical contacts that are elastic. The gravity is not able to provide enough force for the electrical connection between the burn-in socket and the IC package.

In view of the foregoing, an electrical connector with a retention element is provided.

SUMMARY OF THE INVENTION

Accordingly, an object of the present invention is to provide an electrical connector a retention element also used for heat radiation.

In order to achieve the object set forth, an burn-in socket electrically connecting an IC package to a PCB, comprises a base, a cover, a plurality of contacts and a block-shaped heat sink. The base defines a receiving space for the IC package. The cover is pin-jointed to one side by a pivot of the base and able to rotate around the pivot. A plurality of contacts are retained in the base and partially exposed in the receiving space. The heat sink is located above the IC package and against to the IC package so as to apply its gravity force to the IC package. Top face of the heat sink is below top face of the cover.

Other objects, advantages and novel features of the invention will become more apparent from the following detailed description when taken in conjunction with the accompanying drawings.

DETAILED DESCRIPTION OF THE INVENTION

Reference will now be made in detail to the preferred embodiment of the present invention.

Referring to FIG. 1 to FIG. 7, a burn-in socket 100 is used to electrically connect an IC package 2000 to a PCB (not shown). The burn-in socket comprises a base 100 and a cover 200 pin jointer on opposite sides of the base. The cover defines a depression 201 running through the bottom thereof. A heat sink is fixed in the depression 201.

Figure 1:
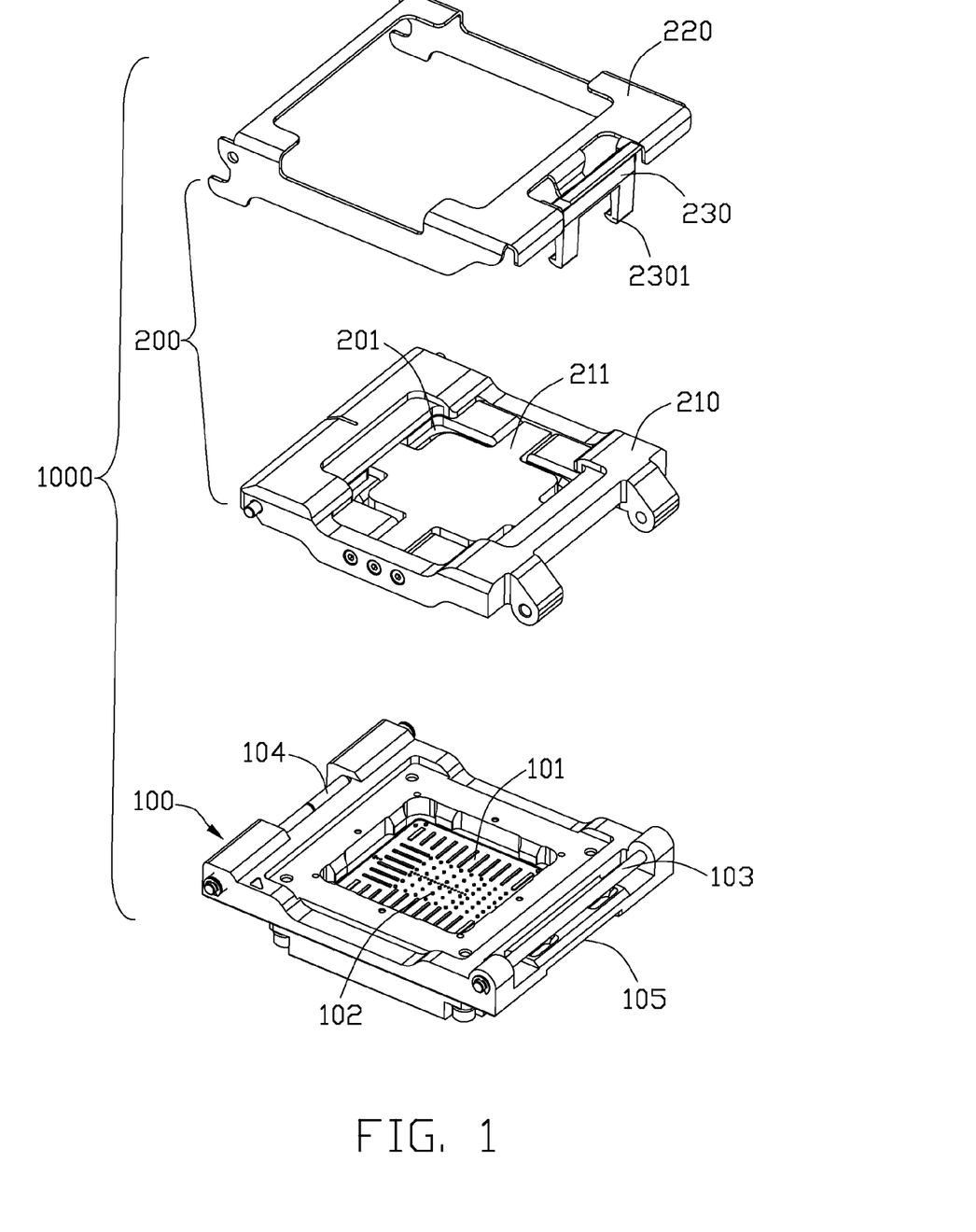
FIG. 1 is an exploded view of a burn-in socket in accordance with the present invention.
Figure 2:
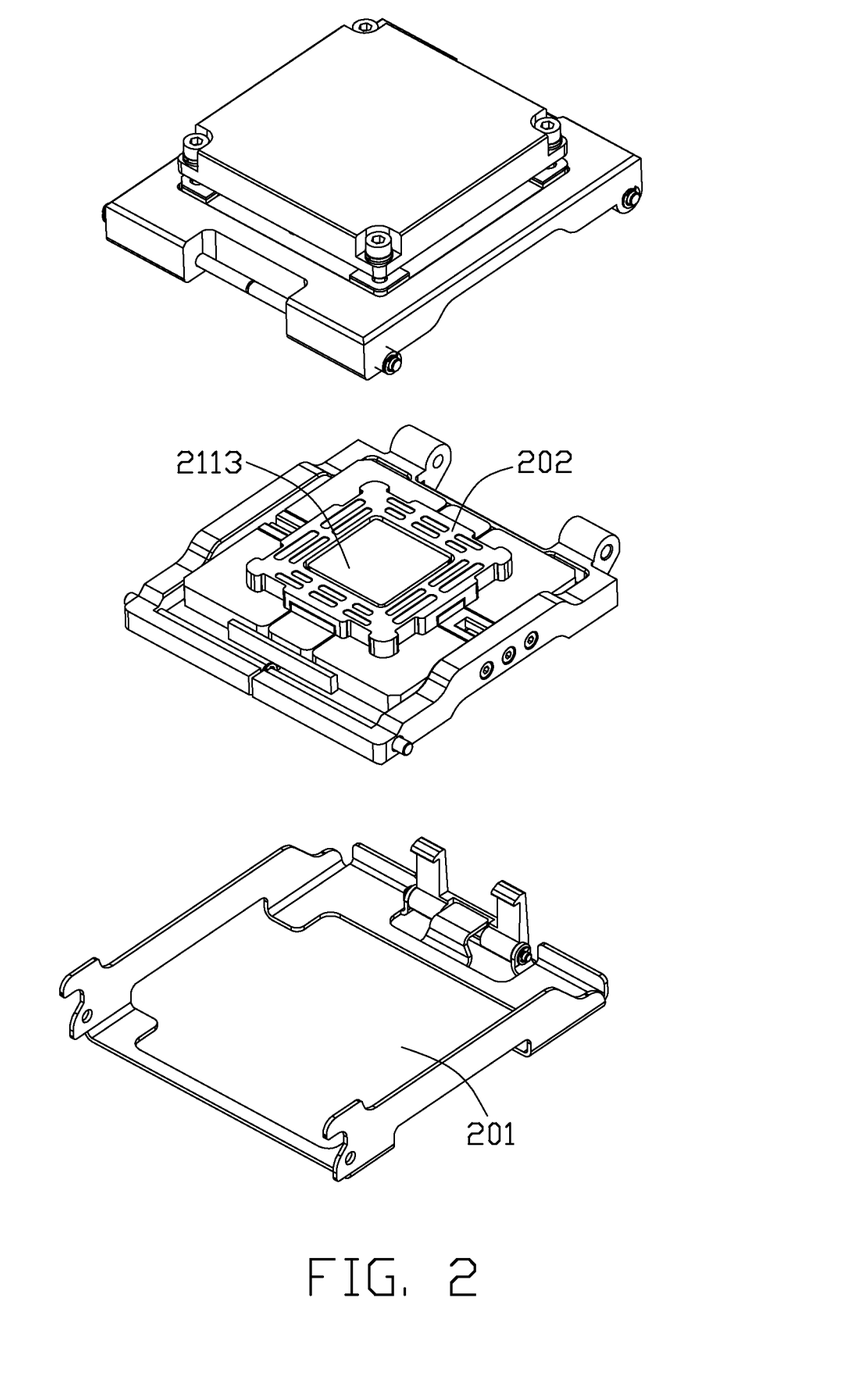
FIG. 2 is an exploded view from another direction of the burn-in socket shown in FIG. 1.

Referring to FIGS. 1-2, the base is shaped as a cuboid and defines a receiving space 101 connecting the depression 201. The IC package is retained in the receiving space 101. A plurality of contacts 102 are partially exposed to the receiving space. The has are assembled with two pivots 103, 104 at opposite sides of the base. The two pivots are disposed parallel to each other.

The cover further comprises a first cover 210 (or a lower cover) and a second cover 220 (or an upper cover). The first cover 210 is pin-jointed to a first pivot 103 on a first side while the second cover 220 is pin-jointed to a second pivot 104 on a second opposite side. The first cover 210 is also pivot-connected to the second cover 220 by a third pivot (not numbered, best shown in FIG. 1).

Figure 3:
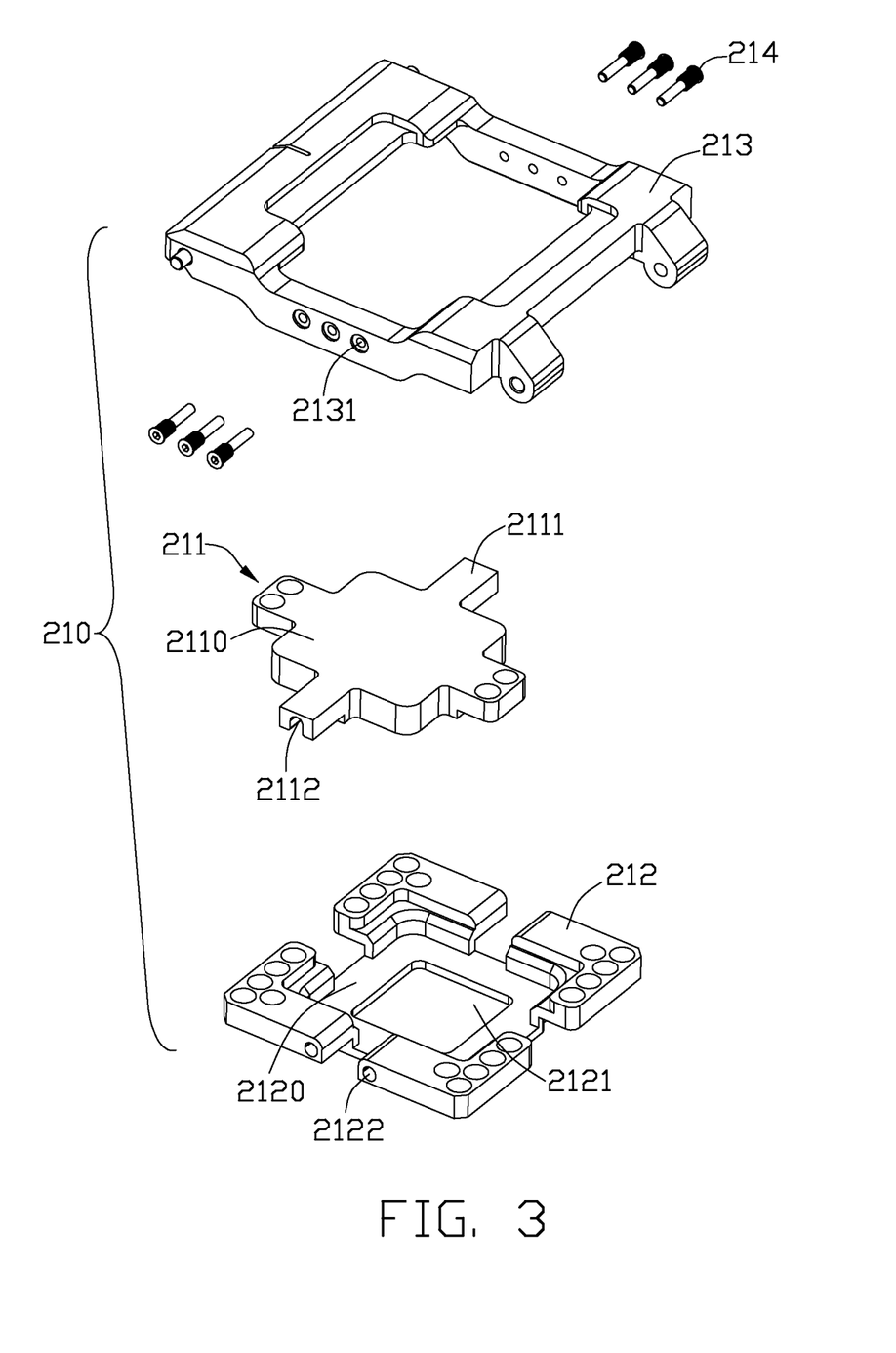
FIG. 3 is an exploded view of the first cover with a heat sink of the burn-in socket shown in FIG. 1.
Figure 4:
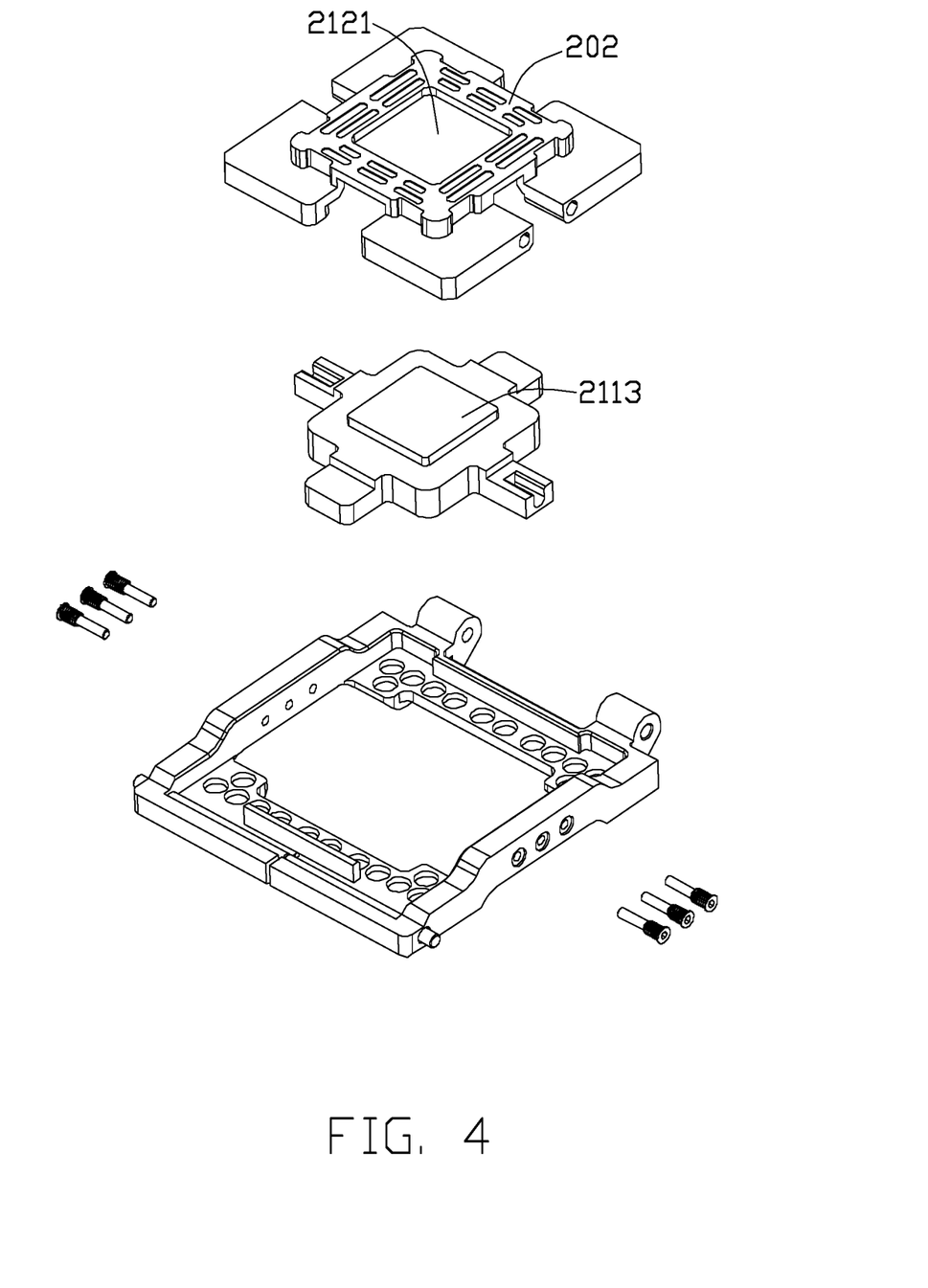
FIG. 4 is another view of a the first cover with a heat sink shown in FIG. 3.
Figure 5:
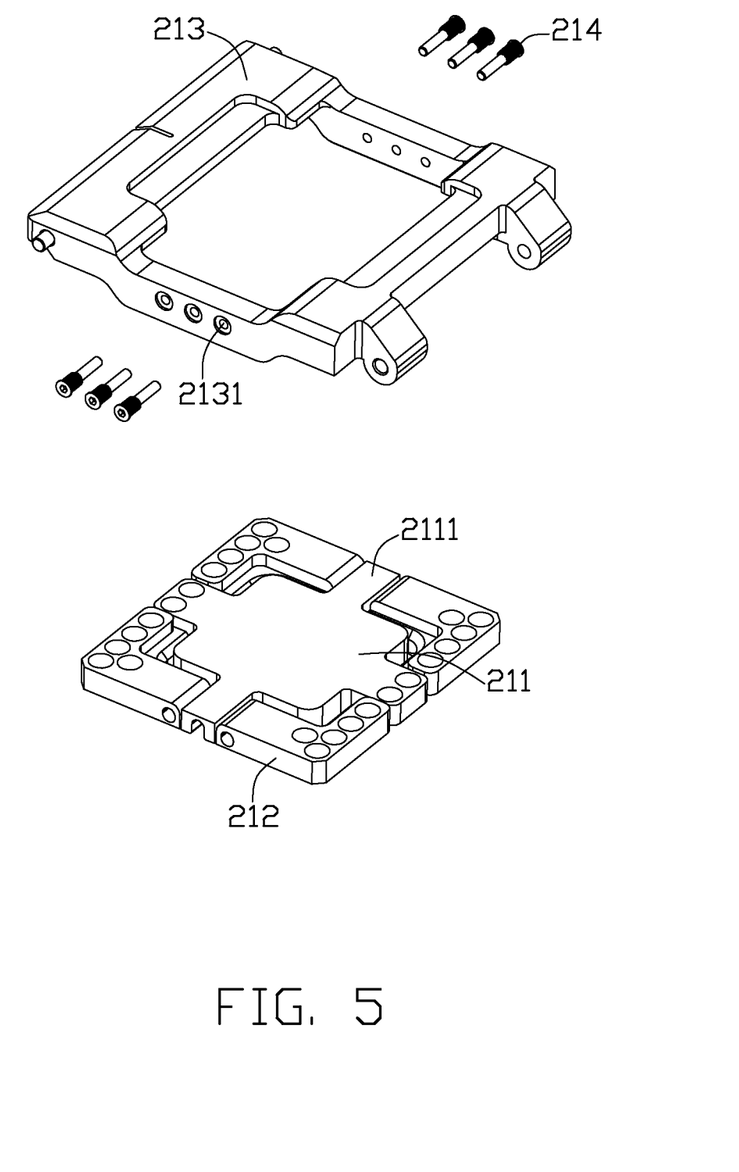
FIG. 5 is a perspective view of heat sink retained on the first cover.
Figure 6:
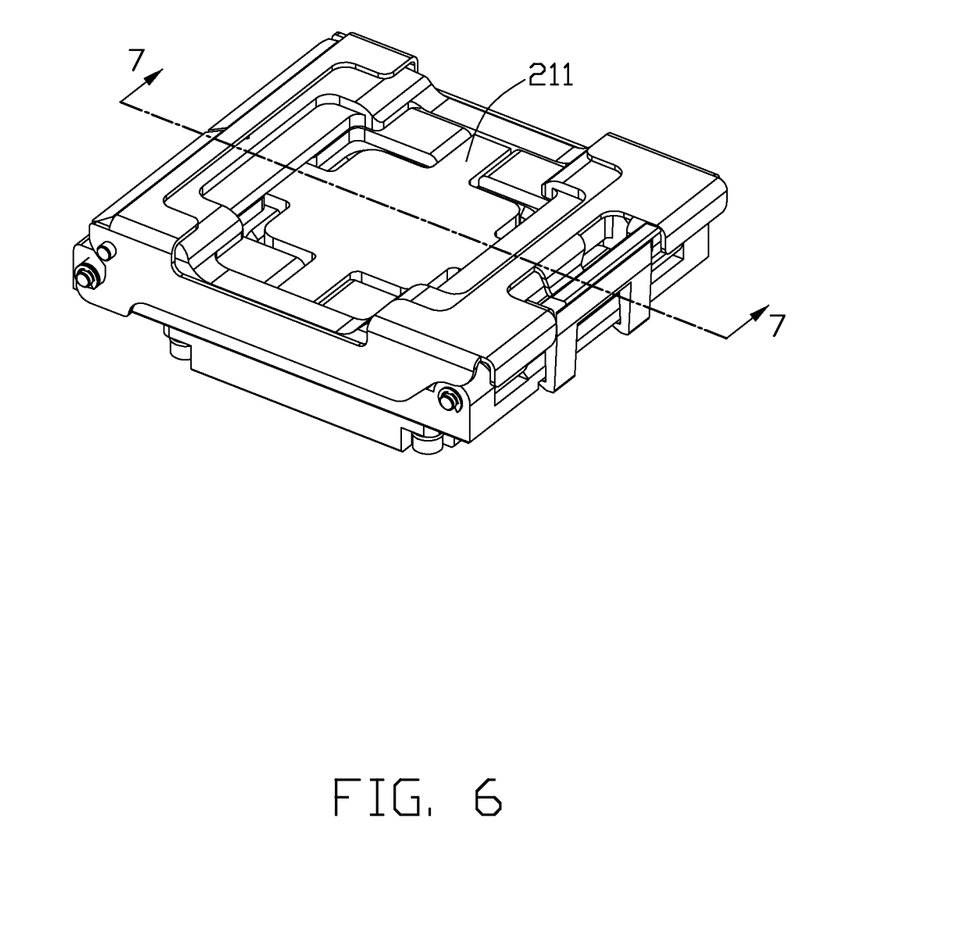
FIG. 6 is an perspective view of the burn-in socket with an IC package.
Figure 7:
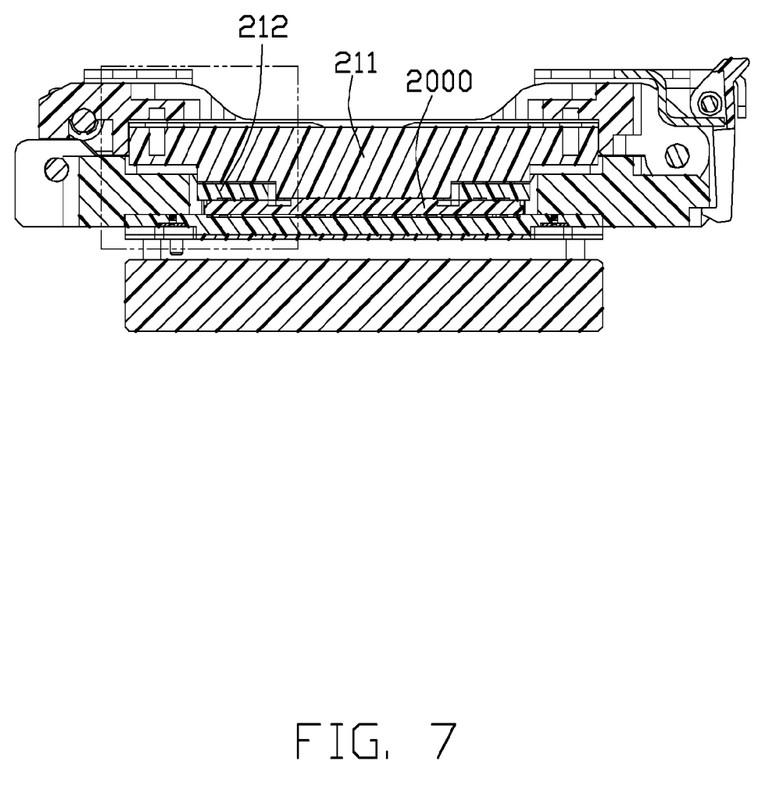
FIG. 7. is a cross-sectional view along a line A-A of the burn-in socket with an IC package shown in FIG. 6.
Figure 7A:
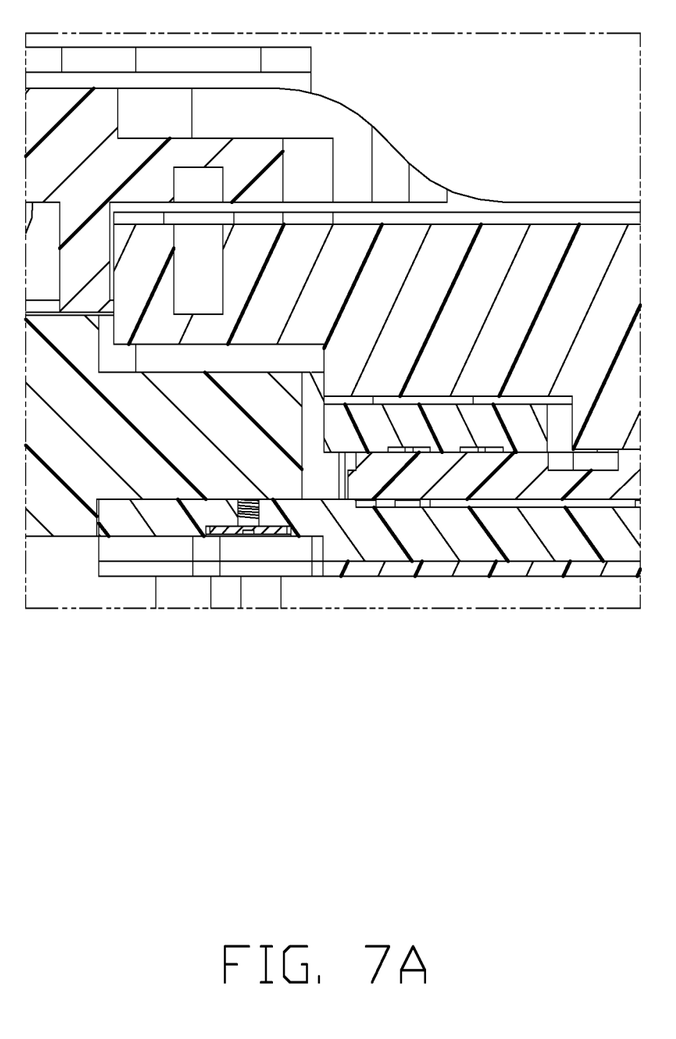
FIG. 7(A) is a partially enlarged cross-sectional view of the burn-in socket with an IC package shown in FIG. 7.

Combining FIGS. 3-5, the first cover 210 comprises a fixed or fixing element 212 exposed both the bottom face and top face thereof. The fixed element 212 defines a retaining space 2120 and an opening 2121 downward. The heat sink 211 is block-shaped and stuffed. The heat sink 211 is received in the retaining space 2120. The first cover 210 further includes a frame 213 assembled with the fixed element 212 via pins 214 extending through the corresponding holes 2131 in the frame 213 and the corresponding retaining holes 2122 in the fixed element 212. The frame 213 of the first cover 210 is assembled to the first pivot 103.

The heat sink 211 comprises a main portion 211 and several supporting portions 2111 extending from the main portion 211. The shape of the retaining space 2120 is just suit for of the heat sink 211. The heat sink 211 defines a bottom face 2113 protruding from the opening 2121 of the fixed element 212. The first cover 210 also defines a pressing face 202 (or the bottom face) aligned with the bottom face 2113 of the heat sink 211. The heat sink 211 and the fixed element 212 are against to the IC package 2000 and retain the IC package 2000 by this means (best shown in FIG. 7). The supporting portions 2111 each comprises a hole 2112 corresponding to a retaining hole 2122 set on the fixed element 212. Several pins 214 are retained in the holes and hold the heat sink 211 and the fixed element 212. Notably, the heat sink 211 is essentially confined and retained between the frame 213 and the fixed element 212 in a floating manner in the vertical direction before pressing against the IC package 2000.

The second cover comprises a pair of latches 230 with barbs locking in corresponding recesses 105 (best shown in FIG. 1) defined on the base 100. The assembling process is as follows. First, the heat sink is positioned in the retaining space 2120 and the pins 214 are inserted into the retaining holes 2122 and holes 2112. And then lay the IC package 1000 into the receiving space. The third step is to rotate the second cover 220. The second cover 220 drives the first cover 210 until the first and second covers parallel to top face of the base 100. At the same time, the bottom face 2110 presses against to the IC package 2000 to provide enough retaining force by gravity force, which guarantee a better electrical connection. A top face of the heat sink 211 is below a top face of the cover 200 so as to lower height of the whole electrical system.

It is to be understood, however, that even though numerous characteristics and advantages of the present invention have been set forth in the foregoing description, together with details of the structure and function of the invention, the disclosure is illustrated only, and changes may be made in detail, especially in matters of shape, size, and arrangement of parts within the principles of the invention to the full extent indicated by the broad general meaning of the terms in which the appended claims are expressed.

We claim:

1. A socket assembly comprising:
   a base defining a receiving cavity between two opposite first and second ends of said base in a horizontal direction;
   an electronic package received in the receiving cavity;
   a plurality of contacts disposed in the base and upwardly electrically and mechanically connecting with the electronic package;
   a cover located above the base in a vertical direction perpendicular to said horizontal direction, and having a first portion pivotally mounted with the first end of the base and a second portion opposite to said first portion and swinging between open and locked positions to be releasably locked to the second end of the base so as to hold the electronic package in position;
   a heat sink secured to the cover to apply a downward force upon the electronic package when said cover is moved to the locked position; wherein
   said cover includes a lower part and an upper part, in the vertical direction, pivotally assembled to each other; wherein
   said heat sink is secured to the lower part; wherein
   the lower part includes a frame and a fixing element to commonly retain the heat sink therebetween along said vertical direction in a floating manner for compliance with the electronic package.

2. The socket assembly as claimed in claim 1, wherein the fixing element defines an opening in compliance with a contour of the heat sink to compliantly and supportably receive the heat sink therein while the frame secures the heat sink via a pin extending therethrough in a transverse direction.

3. The socket assembly as claimed in claim 2, wherein the fixing element is secured to the frame via a plurality of pins extending transversely through the frame.

4. The socket assembly as claimed in claim 1, wherein said lower part and said upper part are pivotally assembled to each other around the second portion.

5. The socket assembly as claimed in claim 4, wherein the upper part includes a first hook around said second portion to lock to the base for securing said cover in the locked position with regard to the base.

6. The socket assembly as claimed in claim 5, wherein the upper part further includes a second hook around the first portion to lock to the base so as to prevent the first hook from leaving the base.

* * * * *